United States Patent Office 3,475,176

Patented Oct. 28, 1969

3,475,176

AZIDE SENSITIZED PHOTOSENSITIVE PREPOLYMER COMPOSITIONS

Frederick J. Rauner, Rochester, N.Y., assignor to Eastman Kodak Company, Rochester, N.Y., a corporation of New Jersey No Drawing. Filed Sept. 6, 1966, Ser. No. 577,178
Int. Cl. G03c *1/70*
U.S. Cl. 96—115 9 Claims

ABSTRACT OF THE DISCLOSURE

Photosensitive compositions are described which comprise a prepolymer of a diallyl ester of an aromatic dicarboxylic acid containing residual allylic unsaturation, a sensitizing amount of an aromatic azide, and optionally, a pyrylium dye salt.

The present invention relates to photosensitive compositions. In one of its more specific aspects, the present invention relates to photosensitive compositions suitable for use as photoresists in the preparation of lithographic plates, in etching operations, and the like.

Photomechanical processes using light-sensitive resin layers to prepare lithographic and other printing plates, and to make resist images for plating, etching, and the like, are well known. The light-sensitive resin layers may be composed of normally insensitive polymers impregnated with light-sensitive materials. Thus, a layer of albumen, glue, gelatin, or shellac can be impregnated with potassium bichromate, exposed to a light image to insolubilize the exposed areas, and then treated with suitable processing liquid to remove the portions of the layer not hardened by exposure.

Alternatively, the light-sensitive layer may comprise polymeric materials which are inherently light sensitive. However, since the sensitivity of such polymers is generally low and confined to the short wavelength portions of the spectrum, it is a common practice to add compounds (referred to as sensitizers) to such polymers to increase their effective sensitivity and to shift their spectral sensitivity toward the longer wavelength portions of the spectrum. Increasing the sensitivity of such polymeric materials and shifting their spectral sensitivity into the visible region of the spectrum has several advantages: inexpensive and convenient light sources can be utilized; exposure time is reduced; recording of a wide range of colors in proper tonal relationship is possible; projection printing through various optical systems can be accomplished; etc.

The effectiveness of such sensitizing compounds is greatly influenced by the systems in which they are employed. Many photosensitive compositions containing polymer and sensitizer are adversely affected by the presence of oxygen, thus necessitating protection from aerial oxidation during exposure.

The selection of polymeric materials for use as etching resists and as materials for use in lithographic and similar printing processes is made on the basis of physical and chemical properties (good dimensional stability; high physical strength; corrosion resistance; ability to withstand heat, cold, moisture, sunlight, acids, alkali, and fungus; etc.) exhibited by such polymeric materials on photographic hardening.

One object of my invention is to provide novel photosensitive compositions.

Another object of my invention is to provide novel photosensitive compositions having improved stability toward oxygen.

Another object of my invention is to provide new sensitizer compounds capable of increasing the light sensitivity of polymeric materials, and to extend the radiation sensitivity of photosensitive compositions into longer wavelength regions.

A further object of my invention is to provide new photosensitive compositions suitable for use as etching resists.

A still further object of my invention is to provide new printing plates for use in lithographic and other printing processes.

Other objects of my invention will become apparent from the following descriptions and claims.

The novel photosensitive compositions of the present invention comprise (a) a prepolymer of a diallyl ester of an aromatic dicarboxylic acid, said diallyl ester having the general formula:

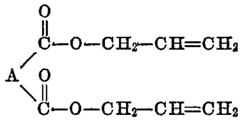

wherein A represents a divalent aromatic nucleus, e.g., phenylene, methylphenylene, butylphenylene, naphthylene, etc., and (b) an aromatic azide which acts as a sensitizer for the diallyl ester prepolymer.

The prepolymers of diallyl esters of aromatic dicarboxylic acids employed in the formation of the novel photosensitive compositions of the present invention are thermoplastic, film-forming compositions of relatively low molecular weight and are characterized as containing substantial residual allylic unsaturation. Such prepolymers are activated by actinic radiation, whereby they polymerize to higher molecular weight polymers. The prepolymers can be used in admixture with unpolymerized diallyl ester monomer in the photosensitive compositions of the invention.

Preferred diallyl ester prepolymers are homopolymers of diallyl phthalate, diallyl isophthalate and diallyl terephthalate, although copolymers of mixtures of such diallyl esters and with other vinyl monomers can also be employed to form the photosensitive compositions of the present invention. The molecular weight of the prepolymer is not critical and can be greatly varied. However, the prepolymer should be soluble in the organic coating solvent employed in preparing the photosensitive composition.

The preparation of the present prepolymers used in the photosensitive compositions of the invention is well known to those skilled in the art, reference being made to U.S. Patents 3,087,915 and 3,113,123. Such prepolymers can be prepared by polymerizing the monomer with a free radical catalyst, e.g., peroxides (butyl peroxide, dicumyl peroxide, benzoyl peroxide, hydrogen peroxide, etc.), and terminating the polymerization before gelation of the reaction mixture has occurred. Prepolymers suitable for use in the practice of the invention typically have a degree of polymerization of about 25–40% conversion of monomer to prepolymer.

Sensitizing amounts of aromatic azides are employed in the photosensitive compositions of the present invention to extend the photosensitivity of the diallyl ester prepolymers to more desirable or longer wavelengths. The aromatic azides include compounds in which an azide group (—$N_3$) is bonded to an aromatic ring either directly or through a carbonyl group. In general, aromatic azides containing no water-solubilizing groups (such as carboxylic acid groups, sulfonic acid groups, and salts thereof) are useful in the process of this invention. Preferred aromatic azides are those containing one or more of the following groups: azidophenyl, azidostyryl, azidobenzal, azidobenzoyl, and azidocinnamoyl. Several aromatic azides suitable for use as sensitizers in the photosensitive compositions of this invention are shown in Table I.

TABLE I

| Compound No. | Name of Compound |
|---|---|
| 1 | 4,4'-diazidochalcone. |
| 2 | 4-azido-4'-(4-azidobenzoyl ethoxy) chalcone. |
| 3 | N,N-bis-p-azidobenzal-p-phenylenediamine. |
| 4 | 1,2,6-tri(4'-azidobenzoxy)hexane. |
| 5 | 1-azido-2-chloro-benzoquinone. |
| 6 | 2,4-diazido-4'-ethoxyazobenzene. |
| 7 | 2,6-di(4'-azidobenzal)-4-methyl cyclohexanone. |
| 8 | 4,4'-diazidobenzophenone. |
| 9 | 2,5-diazido-3,6-dichlorobenzoquinone. |
| 10 | 2,5-bis(4-azidostyryl)-1,3,4-oxadiazole. |
| 11 | 2-(4-azidocinnamoyl)thiophene. |
| 12 | 2,5-di(4'-azidobenzal)cyclohexanone. |
| 13 | 4,4'-diazido diphenylmethane. |
| 14 | 1-(4-azidophenyl)-5-furyl-2-penta-2,4-dien-1-one. |
| 15 | 1-(4-azidophenyl)-5-(4-methoxyphenyl)-penta-1,4-dien-3-one. |
| 16 | 1-(4-azidophenyl)-3-(1-naphthyl)propene-1-one. |
| 17 | 1-(4-azidophenyl)-3-(4-dimethylaminophenyl)-propen-1-one |
| 18 | 1-(4-azidophenyl)-5-phenyl-1,4-pentadien-3-one. |
| 19 | 1-(4-azidophenyl)-3-(4-nitrophenyl)-2-propen-1-one. |
| 20 | 1-(4-azidophenyl)-3-(2-furyl)-2-propen-1-one. |
| 21 | 1,2,6-tri(4'-azidobenzoxy)hexane. |
| 22 | 2,6-bis-(4-azidobenzilidine-p-tert butyl)cyclohexanone. |

The aromatic azide sensitizer can be employed in combination with a sensitizing amount of a pyrylium, thiapyrylium or selenopyrylium dye salt such as represented by the following formula:

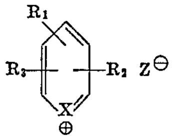

wherein $R_1$, $R_2$ and $R_3$ can each represent an alkyl group having 1 to 15 carbon atoms (e.g., methyl, ethyl, propyl, butyl, amyl, hexyl, chloroethyl, chlorobutyl, fluoroethyl, dichlorobutyl, etc.); an aryl group (e.g., phenyl, naphthyl, tolyl, ethylphenyl, propylphenyl, methoxyphenyl, ethoxyphenyl, dimethoxyphenyl, hydroxyphenyl, hydroxyethoxyphenyl, chlorophenyl, dichlorophenyl, azidophenyl, nitrophenyl, aminophenyl, dimethylaminophenyl, etc.); or an alkoxy group (methoxy, ethoxy, propoxy, butoxy, amyloxy, hexoxy, chloroethoxy, chlorobutoxy, dichlorobutoxy, etc.); X is a hetero atom (e.g., oxygen, sulfur, selenium, etc.); and Z is any suitable anionic function (e.g., perchlorate, fluoroborate, chloride, bromide, fluoride, thiocyanate, sulfate, etc.). Specific examples of such dye salts effective in the practice of this invention are shown in Table II.

TABLE II

| Compound No. | Name of Compound |
|---|---|
| 23 | 2,4,6-triphenyl pyrylium perchlorate. |
| 24 | 4-(4-methoxyphenyl)-2,6-diphenyl pyrylium perchlorate. |
| 25 | 2,6-bis(4-methoxyphenyl)-4-phenyl pyrylium perchlorate. |
| 26 | 6-(4'-methoxyphenyl)-2,4-diphenyl pyrylium perchlorate. |
| 27 | 4-(4-amyloxyphenyl)-2,6-bis(4-ethylphenyl)-pyrylium perchlorate. |
| 28 | 2,4,6-triphenyl pyrylium fluoroborate. |
| 29 | 2,6-bis(4-ethylphenyl)-4-(4-amyloxyphenyl)thiapyrylium perchlorate. |
| 30 | 2,4,6-triphenyl thiapyrylium perchlorate. |
| 31 | 4-(4-methoxyphenyl)-2,6-diphenyl thiapyrylium perchlorate. |
| 32 | 6-(4-methoxyphenyl)-2,4-diphenyl thiapyrylium perchlorate. |
| 33 | 2,4,6-tri(4-methoxyphenyl)thiapyrylium perchlorate. |
| 34 | 2,6-bis(4-ethylphenyl)-4-phenyl thiapyrylium perchlorate. |
| 35 | 4-(4-amyloxyphenyl)-2,6-bis(4-ethylphenyl)-thiapyrylium perchlorate. |
| 36 | 2,4,6-triphenyl thiapyrylium fluoroborate. |
| 37 | 2,4,6-triphenyl thiapyrylium sulfate. |
| 38 | 4-(4-methoxyphenyl)-2,6-diphenyl thiapyrylium fluoroborate. |
| 39 | 2,4,6-triphenyl thiapyrylium chloride. |
| 40 | 2-(4-amyloxyphenyl)-4,6-diphenyl thiapyrylium fluoroborate. |
| 41 | 4-(4-amyloxyphenyl)-2,6-bis(4-methoxyphenyl) thiapyrylium perchlorate. |
| 42 | 2,6-bis(4-ethylphenyl)-4-(4-methoxyphenyl)-thiapyrylium perchlorate. |

When such dye salts are employed in combination with the aromatic azides, the action of the dye salts is one of supersensitization, effectuating a further shift of the sensitivity of the diallyl ester composition, thereby rendering the present photosensitive composition sensitive to still longer wavelengths.

The organic solvent employed to formulate the compositions of the present invention can be any organic solvent capable of dissolving both the diallyl ester propolymer and the aromatic azide. Preferred solvents include aromatic hydrocarbons and halogenated hydrocarbons such as benzene, xylene, chlorobenzene, trichloroethylene, perchloroethylene, etc.

The concentration of the aromatic azides can be varied over a wide range from about 0.1% to 100% by weight of the prepolymer. Preferred concentrations are generally within the range of about 0.5% to about 50% by weight of the prepolymer.

The concentration of the pyrylium, thiapyrylium and selenopyrylium dye salts, when employed in combination with the aromatic azide as the supersensitizer for the diallyl ester prepolymer, can be varied over approximately the same range as that set forth for the aromatic azide. The ratio of azide to salt is not critical insofar as the synergistic supersensitizing effect is concerned, although the nature of the shift resulting from the addition of the supersensitizer may change with a change in the ratio of the two. The optimum concentrations of the aromatic azide when used alone, or the optimum concentrations of the aromatic azide and the organic salt when employed in combination, can vary for each particular application of the photosensitive compositions of the present invention in accordance with the results desired.

The present photosensitive compositions can be coated on a wide variety of photographic supports. Typical useful supports are those used to prepare lithographic and other printing plates such as mechanically roughened or grained aluminum plates and copper plates.

The following specific examples will serve to more fully explain the practice of my invention. However, it will be understood that these are only examples and in no way limiting of this invention.

Example A

A 2% (weight/volume) solution of diallyl isophthalate prepolymer in chlorobenzene was prepared. A sample of this unsensitized solution was whirl coated at 78 r.p.m. on mechanically roughened aluminum sheets, after which the coating was air dried. To other samples of the diallyl isophthalate prepolymer solution were added 10%, based on the weight of the prepolymer, of the aromatic azides indicated below. These samples were similarly coated on mechanically roughened aluminum sheets and air dried. Each of the coated samples was exposed in an $f/4.4$ spectrograph made from a Bausch and Lomb monochromator. The light source was an 800-watt xenon arc lamp. The exposed coatings were then developed by bathing in xylene to remove unhardened prepolymer in unexposed areas leaving an image of hardened polymer in exposed areas. Each of the coatings were tested for their spectral sensitivity ranges and peaks and the results of these tests are listed in Table III below.

TABLE III

| Sensitizer Compound (Numbers refer to Compounds listed in Table I) | Spectral Response | |
|---|---|---|
| | Range (mμ) | Peak(s) (mμ) |
| None | 270–290 | 280 |
| 1 | 250–440 | 370 |
| 2 | 250–430 | 290, 370 |
| 3 | 260–430 | 290, 390 |
| 4 | 250–350 | 300 |
| 5 | 260–490 | 430 |
| 6 | 260–500 | 310, 450 |
| 7 | 260–470 | 390 |
| 8 | 250–390 | 360 |
| 9 | 260–380 | 280, 350 |
| 10 | 250–450 | 390 |
| 11 | 250–420 | 350 |

Additional grained aluminum sheets were prepared and coated with a photosensitive prepolymer as described above in combination with an azide sensitizer listed in Table III, using an identical procedure as described above. The resulting sensitized sheets were then exposed to a high contrast lithographic negative with a xenon arc lamp. The coatings hardened in the exposed areas. The plates were tray-developed using chlorobenzene to remove the unhardened, unexposed areas leaving hardened polymeric material in the exposed areas. The resulting plates were hand inked to produce crisp, visible images. The diallyl isophthalate prepolymer used to prepare the photosensitive compositions contained substantial residual allylic unsaturation, it having a specific gravity at 25° C. of 1.256 and an iodine No. of 64.

Example B

Following the procedure of Example A, coatings of a similar diallyl isophthalate prepolymer, the diallyl isophthalate prepolymer containing 2,6-bis(4-ethylphenyl)-4-(4-amyloxyphenyl)thiapyrylium perchlorate, the diallyl isophthalate prepolymer containing 2,6-di-(4′-azidobenzal)-4-methyl cyclohexanone, and the diallyl isophthalate prepolymer containing both the thiapyrylium salt and the aromatic azide were respectively prepared. The spectral response was determined after exposure in a monochromator as described in Example A. The results as shown in Table IV were obtained employing the indicated concentrations (based on the weight of the prepolymer) of the azide and the thiapyrylium salt.

TABLE IV

| | Azide Conc., percent | Pyrylium Salt Conc., | Spectral Response: Range (mμ) | Spectral Response: Peak(s) (mμ) |
|---|---|---|---|---|
| Coating No.: | | | | |
| a | | | 270–290 | 280 |
| b | | 10 | 270–290, 410–480 | 280, 440 |
| c | 10 | | 260–470 | 390 |
| d | 10 | 10 | 260–550 | 410 |
| e | 5 | | 260–470 | 380 |
| f | 2.5 | 0.5 | 260–510 | 280, 380 |
| g | 0.5 | 2.5 | 260–515 | 280, 380 |
| h | 50.0 | 50.0 | 260–550 | (1) |
| i | 50 | 0.5 | 260–500 | 390 |
| j | 0.5 | 50.0 | 260–560 | 420 |

1 Level from 340 to 500.

Additional mechanically roughened aluminum sheets were prepared and coated with each of Coatings Nos. *b-j* described in Table IV, after which they were exposed to a high contrast lithographic negative with a carbon arc lamp. Exposed areas hardened and became ink-receptive, thereby rendering the sheets suitable for use as lithographic printing plates when tray developed in chlorobenzene to remove unexposed and unhardened prepolymer. Similar results are obtained when diallyl phthalate having comparable allylic unsaturation is substituted for the diallyl isophthalate prepolymer.

Example C

A coating useful as a resist was prepared from a solution containing 20.0 grams of diallyl terephthalate prepolymer and 0.4 gram of 2,6-di-(4′-azidobenzal)-4-methyl cyclohexanone in 100 milliliters of monochlorobenzene. About 10 milliliters of the above solution were flow coated over a gravure copper plate and dried in a vertical position for 5 minutes at 40° C. A uniform glossy coating was obtained. The dried coating was exposed through a line negative for 3 minutes at 3 feet to a 35-ampere Macbeth carbon arc. A 0.15 neutral density increment step tablet was included to obtain a measurement of photographic speed. The exposed plate was tray developed in xylene to remove prepolymer in unexposed areas, rinsed with water and dried in air. A resist image of hardened or polymerized prepolymer remained in the areas of exposure. The developed plate was immersed in a 48° Baumé ferric chloride solution and etched for 2 hours at about 20° C. At the end of this time, the photoresist image was still intact and the copper plate was etched to a depth of about 0.006 inch.

The foregoing examples have illustrated the preparation and use of the novel photosensitive compositions of the present invention. The preparation and exposure of the photosensitive elements described in the above examples were carried out in the presence of air, and no adverse effect on the photosensitivity of the compositions was noted. Thus, coatings of the elements had the same photographic speed when exposed in the presence of air as when exposures were made in a vacuum.

Although the invention has been described in considerable detail with particular reference to preferred embodiments thereof, variations and modifications can be effected within the spirit and scope of the invention as described hereinbefore and as defined in the appended claims.

I claim:

1. A composition of matter sensitive to actinic radiation and insensitive to oxygen, said composition of matter comprising:

(a) a prepolymer of a diallyl ester of an aromatic dicarboxylic acid containing residual allylic unsaturation and capable of being polymerized to a higher molecular weight when exposed to actinic radiation, said diallyl ester having the general formula:

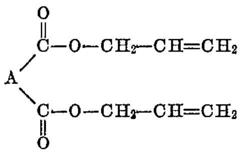

wherein A represents a divalent aromatic nucleus, (b) a sensitizing amount of an aromatic azide, and (c) a sensitizing amount of an organic salt having the general formula:

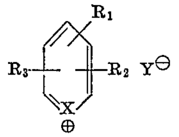

wherein $R_1$, $R_2$ and $R_3$ each represents a group selected from the class consisting of an alkyl radical having 1 to 15 carbon atoms, an alkoxy radical, an aryl radical; X is a hetero atom selected from the group consisting of oxygen, sulfur and selenium; and Y is an anionic function which does not interfere with sensitization of the composition by the cation.

2. A composition of matter as defined by claim 1 wherein said aromatic azide contains a substituent selected from the group consisting of azidophenyl, azidostyryl, azidobenzal, azidobenzoyl and azidocinnamoyl radicals.

3. A composition of matter as defined by claim 1 wherein said aromatic azide is selected from the group consisting of 4,4′-diazidochalcone, 4-azido-4′-(4-azidobenzoyl ethoxy)chalcone, N,N-bis-p-azidobenzal-p-phenylenediamine, 1,2,6-tri(4′-azidobenzoxy)hexane, 1-azido-2-chloro-benzoquinone, 2,4-diazido-4′-ethoxyazobenzene, 2,6-di-(4′-azidobenzal)-4-methyl cyclohexanone, 4,4′-diazidobenzophenone, 2,5-diazido-3,6-dichlorobenzoquinone, 2,5-bis(4-azidostyryl)-1,3,4-oxadiazole, and 2-(4-azidocinnamoyl)thiophene.

4. A composition of matter as defined by claim 1 wherein the degree of polymerization of the diallyl ester to the prepolymer is about 25 to 40 percent.

5. A composition of matter as defined by claim 1 wherein said organic salt is 2,6-bis(4-ethylphenyl)-4-(4-amyloxyphenyl)thiapyrylium perchlorate.

6. A composition of matter as described in claim 1 wherein the diallyl ester is diallyl isophthalate.

7. A composition of matter as described in claim 1 wherein the diallyl ester is diallyl terephthalate.

8. A composition of matter sensitive to actinic radiation comprising a prepolymer of a diallyl ester of an aromatic dicarboxylic acid containing residual allylic unsaturation and capable of being polymerized to a higher molecular weight when exposed to actinic radiation, said diallyl ester being selected from the group consisting of diallyl phthalate, diallyl isophthalate and diallyl terephthalate, said composition being sensitized with an aromatic azide and a thiapyrylium dye salt having the general formula:

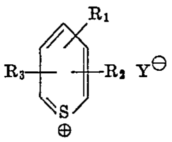

wherein $R_1$, $R_2$ and $R_3$ each represents a group selected from the class consisting of an alkyl radical having 1 to 15 carbon atoms, an alkoxy radical, and an aryl radical; and Y is an anionic function which does not interfere with sensitization of the composition by the cation.

9. A photosensitive element having coated thereon a layer of the composition defined by claim 1.

References Cited

UNITED STATES PATENTS

| | | | |
|---|---|---|---|
| 3,285,742 | 11/1966 | Wagner | 96—33 |
| 3,376,139 | 4/1968 | Gilano et al. | 96—35.1 |

OTHER REFERENCES

Chemical Abstract, 64 (1966), 15230C.

JOSEPH L. SCHOFER, Primary Examiner

C. A. HENDERSON, Jr., Assistant Examiner

U.S. Cl. X.R.

96—33, 35.1, 86, 91; 204—159.2; 260—78.4